(12) United States Patent
Gupta et al.

(10) Patent No.: US 8,415,089 B1
(45) Date of Patent: Apr. 9, 2013

(54) SINGLE-MASK DOUBLE-PATTERNING LITHOGRAPHY

(75) Inventors: Puneet Gupta, Los Angeles, CA (US); Rani S. Ghaida, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 178 days.

(21) Appl. No.: 12/723,798

(22) Filed: Mar. 15, 2010

(51) Int. Cl.
G03F 7/00 (2006.01)
G03C 5/00 (2006.01)

(52) U.S. Cl. .......................................... 430/311; 430/394

(58) Field of Classification Search .............. 430/5, 311, 430/312, 313, 394
See application file for complete search history.

(56) References Cited

U.S. PATENT DOCUMENTS

| | | | |
|---|---|---|---|
| 6,670,080 B2 * | 12/2003 | Sugita et al. ...................... | 430/5 |
| 8,071,278 B1 * | 12/2011 | Yamamoto ........................ | 430/394 |
| 2004/0091794 A1 * | 5/2004 | Kim et al. ......................... | 430/5 |

OTHER PUBLICATIONS

"Nangate FreePDK45 Generic Open Cell Library," Silicon Integration Initiative, Inc. (Si2), Feb. 26, 2008, updated Jul. 20, 2009, http://www.si2.org/openeda.si2.org/projects/nangatelib, 2 pages.
Finders, J., et al., "Double patterning for 32nm and below: an update," Optical Lithography XXI, Proceedings of SPIE, Feb. 26, 2008, vol. 6924, p. 692408, 12 pages.
Dusa, M., et al., "Pitch Doubling Through Dual Patterning Lithography Challenges in Integration and Litho Budgets," Optical Microlithography XX, Proceedings of SPIE, Feb. 27, 2007, vol. 6920, p. 65200G-1, 10 pages.
Suzuki, K., et al., "Chapter 5: Alignment and Overlay," Microlithography: science and technology (book), Second Edition, Boca Raton: CRC Press, 2007, 58 pages.
Lee, S., et al., "An analysis of double exposure lithography options," Optical Microlithography XXI, Proceedings of SPIE, Feb. 26, 2008, vol. 6924, p. 69242A-1, 12 pages.
Mack, C.A., "Seeing Double," IEEE Spectrum, Nov. 2008, http://spectrum.ieee.org/semiconductors/design/seeing-double/, pp. 46-51.
Arnold, W., et al., "Manufacturing Challenges in Double Patterning Lithography," IEEE International Symposium on Semiconductor Manufacturing, Sep. 25-27, 2006, pp. 283-286.
International Technology Roadmap for Semiconductors, 2007, http://www.itrs.net/Links/2007ITRS/Home2007.htm, 102 pages.
Yamamoto, Y., et al., "Multi-layer reticle (MLR) strategy application to double-patterning/double-exposure for better overlay error control and mask cost reduction," Photomask Technology 2007, Proceedings of SPIE, Sep. 18, 2007, vol. 6730, p. 67302X, 12 pages.
Tseng, C.F., et al., "Comprehensive Comparison between Double Patterning and Double Patterning with Spacer on Sub-50nm Product Implementation," Optical Microlithography XXI, Proceedings of SPIE, Mar. 7, 2008, p. 69241Y-3, 8 pages.
Lee, D., et al., "Impact of registration error of reticle on total overlay error budget," Journal of Vacuum Science and Technology, Nov./Dec. 2006, B24(6), pp. 3105-3109.

(Continued)

Primary Examiner — Stephen Rosasco
(74) Attorney, Agent, or Firm — Withrow & Terranova, PLLC

(57) ABSTRACT

A method of printing a final layout on a wafer comprises printing a first pattern from a first mask located at a first position onto the wafer, shifting the first mask by a predetermined distance to a second position, printing the first pattern from the first mask located at the second position onto the wafer, and applying a trim mask to the wafer.

10 Claims, 13 Drawing Sheets

OTHER PUBLICATIONS

De Beeck, M., et al., "Manufacturability issues with Double Patterning for 50-nm half pitch single damascene applications using RELACS shring and corresponding OPC," Optical Microlithography XX, Proceedings of SPIE, Mar. 26, 2007, p. 65200I, 13 pages.

Liebmann, L., et al., "Enabling Alternating Phase Shifted Mask Designs for a Full Logic Gate Level: Design Rules and Design Rule Checking," Proceedings of Design Automation Conference (DAC'01), Jun. 18-22, 2001, Las Vegas, Nevada, 6 pages.

Shiu, W., et al., "Spacer Double Patterning Technique for Sub-40nm DRAM Manufacturing Process Development," Lithography Asia, Proceedings of SPIE, Nov. 4, 2008, vol. 7140, p. 71430Y, 8 pages.

Chiou, T., et al., "Full-chip pitch/pattern splitting for lithography and spacer double patterning technologies," Lithography Asia, Proceedings of SPIE, Nov. 4, 2008, vol. 7140, p. 71401Z, 12 pages.

Haffner, H., et al., "Paving the way to a full chip gate level double patterning application," Photomask Technology, Proceedings of SPIE, Oct. 30, 2007, vol. 6730, p. 67302C, 12 pages.

Vreugdenhil, E., et al., "Yield Aware Design of gate layer for 45 nm CMOS-ASIC using a high-NA dry KrF systems," Design for Manufacturability through Design-Process Integration II, Proceedings of SPIE, Mar. 19, 2008, vol. 6925, p. 69250D, 12 pages.

Mistry, K, et al., "A 45nm Logic Technology with High-k+Metal Gate Transistors, Strained Silicon, 9 Cu Interconnect Layers, 193nm Dry Patterning, and 100% Pb-free Packaging," IEEE International Electron Devices Meeting, Dec. 10-12, 2007, Washington DC, p. 247-250.

Smayling, M.C., et al., "Low $k_1$ Logic Design using Gridded Design Rules," Design for Manufacturability through Design-Process Integration II, Proceedings of SPIE, Feb. 28, 2008, vol. 6925, p. 69250B, 7 pages.

Pileggi, L., et al., "Exploring Regular Fabrics to Optimize the Performance-Cost Trade Off," IEEE/ACM Design Automation Conference (DAC '03), Jun. 2-6, 2003, Anaheim, California, 12 pages.

Gupta, P., et al., "Electrical Metrics for Lithographic Line-End Tapering," Photomask and Next-Generation Lithography Mask Technology XV, Proceedings of SPIE, Apr. 16, 2008, vol. 7028, p. 70283A, 12 pages.

"What is OpenAccess?", Silicon Integration Initiative, Inc. (Si2), Nov. 12, 2007, http://openeda.org/?page=69, 1 page.

"FreePDK," NCSU EDA Wiki, modified Jan. 14, 2011, http://www.eda.ncsu.edu/wiki/FreePDK, 1 pages.

"Projects," OpenCores, Dec. 4, 2001, accessed Aug. 2, 2011, http://opencores.org/projects, 12 pages.

Bubke, K., et al., "Mask Characterization for Double Patterning Lithography," Journal of Micro/Nanolithography, MEMS, and MOEMS, Jan. 1, 2009, 8(1), p. 011004, 10 pages.

Jeong, K., et al., "Timing Analysis and Optimization Implications of Bimodal CD Distribution in Double Patterning Lithography," Proceedings of the 2009 Asia and South Pacific Design Automation Conference (ASP-DAC '09), Jan. 19-22, 2009, pp. 486-491.

Ghaida, R., et al., "A Framework for Early and Systematic Evaluation of Design Rules," International Conference on Computer-Aided Design, Nov. 2-5, 2009, San Jose, California, 8 pages.

* cited by examiner

SINGLE-MASK DOUBLE-PATTERNING LITHOGRAPHY

STATEMENT OF GOVERNMENT SUPPORT

This invention was made with Government support of Career Award No. 0846196, awarded by the National Science Foundation. The Government has certain rights in this invention.

FIELD OF THE DISCLOSURE

The technology of the disclosure relates generally to double-patterning lithography (DPL), and more particularly to shift-trim DPL using a single photomask.

BACKGROUND OF THE INVENTION

Double-patterning lithography (DPL) is a likely short-term solution for maintaining the current pace of scaling in integrated chip manufacturing. Specifically, DPL is one of the many resolution enhancement techniques (RET) that have been introduced to push the limit of optical lithography. DPL is a natural extension to the single-patterning lithography that uses two separate patterning processes to form two coarser patterns, which are combined to form a single finer pattern.

DPL can be implemented with different manufacturing processes including, but not limited to, litho-etch-litho-etch (LELE), litho-litho-etch (LLE), and spacer double-patterning (SDP). In SDP, features are defined by a sidewall spacer making it more suitable for well-structured memory cells rather than random logic circuit layouts.

DPL suffers from at least three impediments. First, because DPL typically requires the use of two critical photomasks to pattern a single layer, DPL exhibits higher mask-costs when compared to processes employing standard single-patterning. Second, the additional processing steps needed for the second pattern result in reduced fabrication throughput. Lastly, DPL may result in a tight overlay budget because the overlay of the second to the first pattern translates directly into critical dimension (CD) variability.

Another technical problem is CD bimodality, which has serious implication on design including, but not limited to, a larger within-die CD/delay variation. CD and electrical parameters of transistors typically follow a normal distribution with some standard deviation and mean, which deviates slightly from the target. Since DPL has two separate exposure and etch steps, two populations exist: one for transistors formed by the first exposure/etch step and another for transistors formed by the second exposure/etch step.

In response to these shortcomings, attempts have been made to use DPL with a single photomask and, consequently, reduce cost. Such attempts typically consist of splitting a mask area into two regions, each corresponding to a different pattern (similar to a multi-layer reticle). In practice, this approach often results in a fabrication throughput even worse than that of standard-DPL and does not address the various other DPL technical challenges noted above.

Thus, it would be advantageous to employ a methodology that is compatible with standard DPL while mitigating or eliminating the various impediments discussed above.

SUMMARY OF THE INVENTION

In accordance with an exemplary embodiment disclosed herein, there is provided a method of printing a layout on a wafer comprising printing a first pattern from a first mask located at a first position onto the wafer, shifting the first mask by a predetermined distance to a second position, printing the first pattern from the first mask located at the second position onto the wafer, and applying a trim mask to the wafer.

In accordance with another exemplary embodiment, there is provided a photomask comprising a first pattern comprising a plurality of vertical lines and no more than two horizontal lines, wherein each of the no more than two horizontal lines is restricted to a location selected from the group consisting of a top of the first pattern and a bottom of the first pattern. The superimposition of the first pattern at a first position and the first pattern at a second position forms a superset of a final layout.

In accordance with another exemplary embodiment, there is provided a method comprising determining a final layout of a circuit design and decomposing the final layout into a first pattern such that a superimposition of the first pattern and the first pattern shifted a predetermined distance forms a superset of the final layout.

In accordance with another exemplary embodiment, a wafer is prepared by a process comprising the steps of providing a wafer, printing a first pattern from a first mask located at a first position onto the wafer, shifting the first mask by a predetermined distance to a second position, printing the first pattern from the first mask located at the second position onto the wafer and applying a trim mask to the wafer.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

In accordance with an exemplary embodiment disclosed herein, there is provided a method of printing a final layout on a wafer comprising printing a first pattern from a first mask located at a first position onto the wafer, shifting the first mask by a predetermined distance to a second position, printing the first pattern from the first mask located at the second position onto the wafer, and applying a trim mask to the wafer.

More specifically, in accordance with exemplary and non-limiting embodiments, there is described below a method for shift-trim double-patterning lithography (ST-DPL) wherein a single mask is utilized to achieve 2X pitch relaxation. Simply put, the method consists of applying a translational mask-shift to re-use a single photomask having a first pattern for both exposures of DPL to produce a desired final layout. Extra printed features are then removed using a non-critical trim exposure.

As described more fully below, ST-DPL generally involves three steps. First, a first pattern is printed as in standard DPL processes using a photomask. Then, the same photomask is shifted by predetermined nanoscale amount X and a second pattern is printed. Finally, a non-critical trim (a.k.a., block) exposure is applied to remove unnecessary features.

Figure 1:
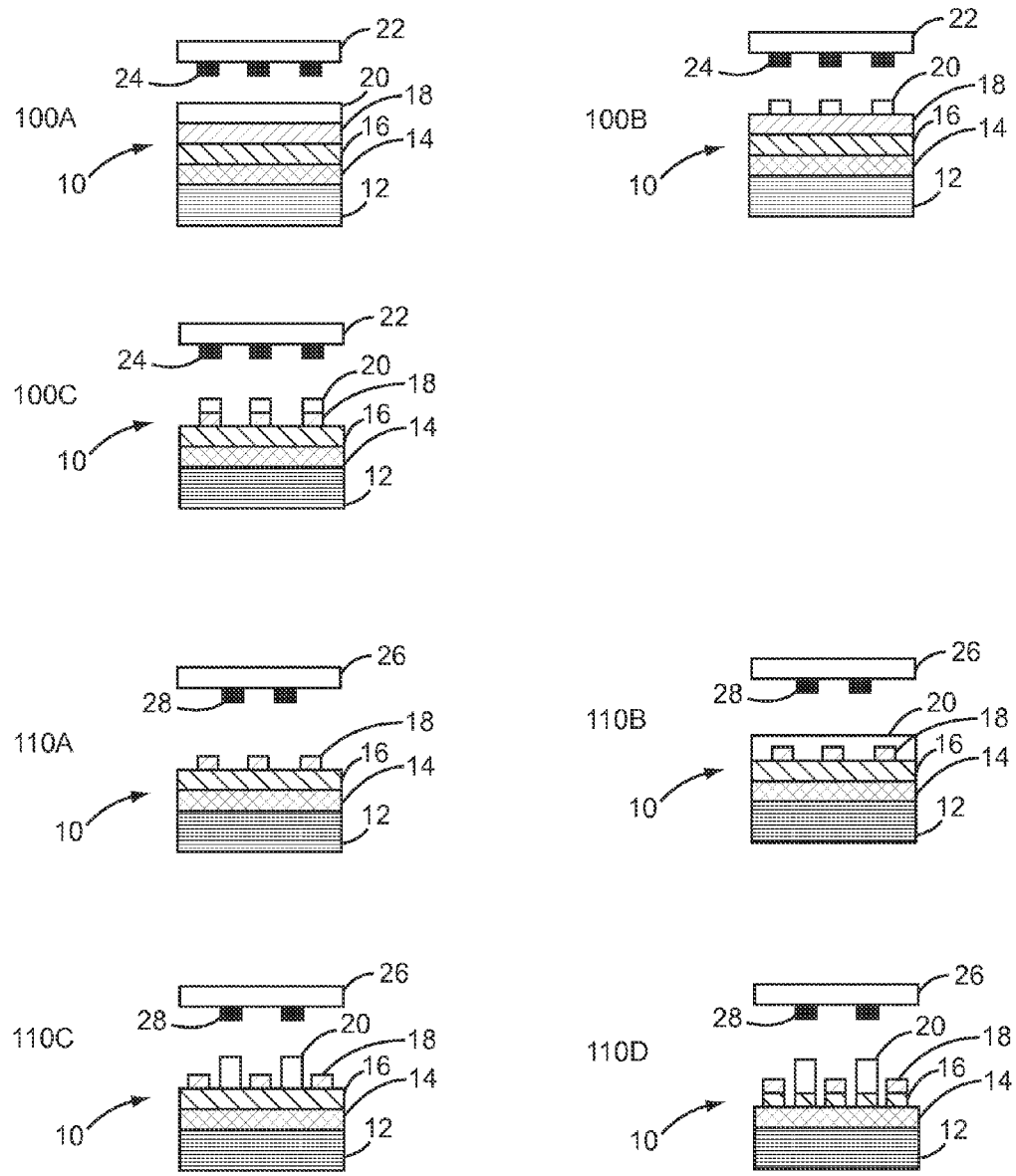
FIG. 1 is an illustration of the process steps of standard double-patterning lithography (DPL)

Before discussing the details of ST-DPL, a description of a variant of standard DPL is illustrated and described. FIG. 1 is an illustration of a series of process steps performed in standard DPL. Specifically, a litho-etch-litho-etch (LELE) DPL process is illustrated. As used herein, both LELE and litho-litho-etch (LLE) DPL processes are referred to as "standard-DPL" processes.

Positive dual-line LELE begins with a wafer 10 formed of a substrate 12 on top of which is deposited the layer to be patterned 14, a second hardmask 16, a first hardmask 18, and a positive photoresist 20. Positioned above the wafer 10 is a first photo mask 22 (hereinafter "first mask 22") (step 100A). A first pattern 24 is printed on the first mask 22 that blocks the transmission of ultraviolet light.

Next, a first lithography is performed whereby the first pattern 24 is transferred to the photoresist 20 via exposure to ultraviolet light with the exposed portions of photoresist 20 being removed, such as by washing away (step 100B).

Next, a first etch is performed to selectively remove the first hardmask 18 (step 100C).

The first mask 22 is then removed and a second mask 26 having a second pattern 28 is positioned and aligned above the wafer 10. The remaining photoresist 20 is then removed (step 110A) and a new layer of the photoresist 20 is applied (step 110B). A second lithography is then performed whereby the second pattern 28 is transferred to the photoresist 20 via exposure to ultraviolet light with the exposed portions of photoresist 20 being removed, such as by washing away (step 110C). A second etch is then performed to selectively remove portions of the second hardmask 18 (step 110D).

Figure 2:
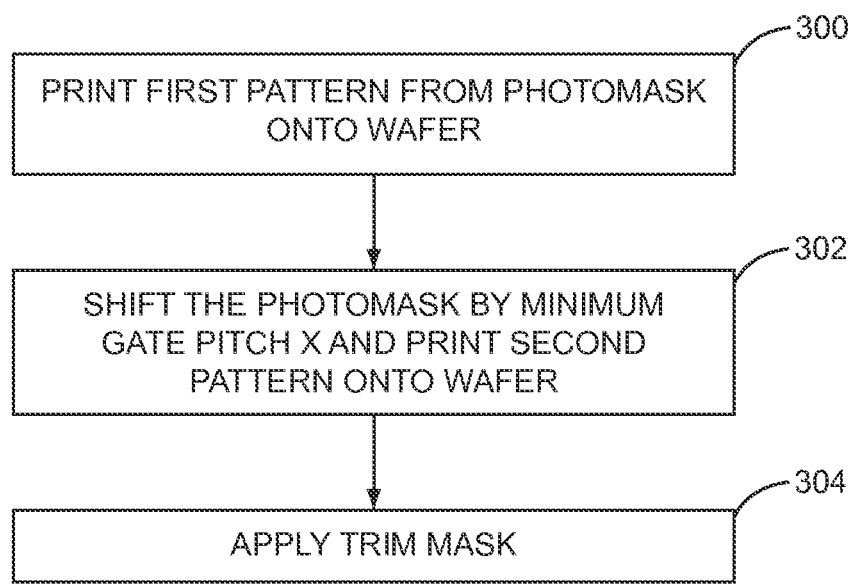
FIG. 2 is a flowchart of shift-trim DPL (ST-DPL) according to an exemplary embodiment disclosed herein.
Figure 3A:
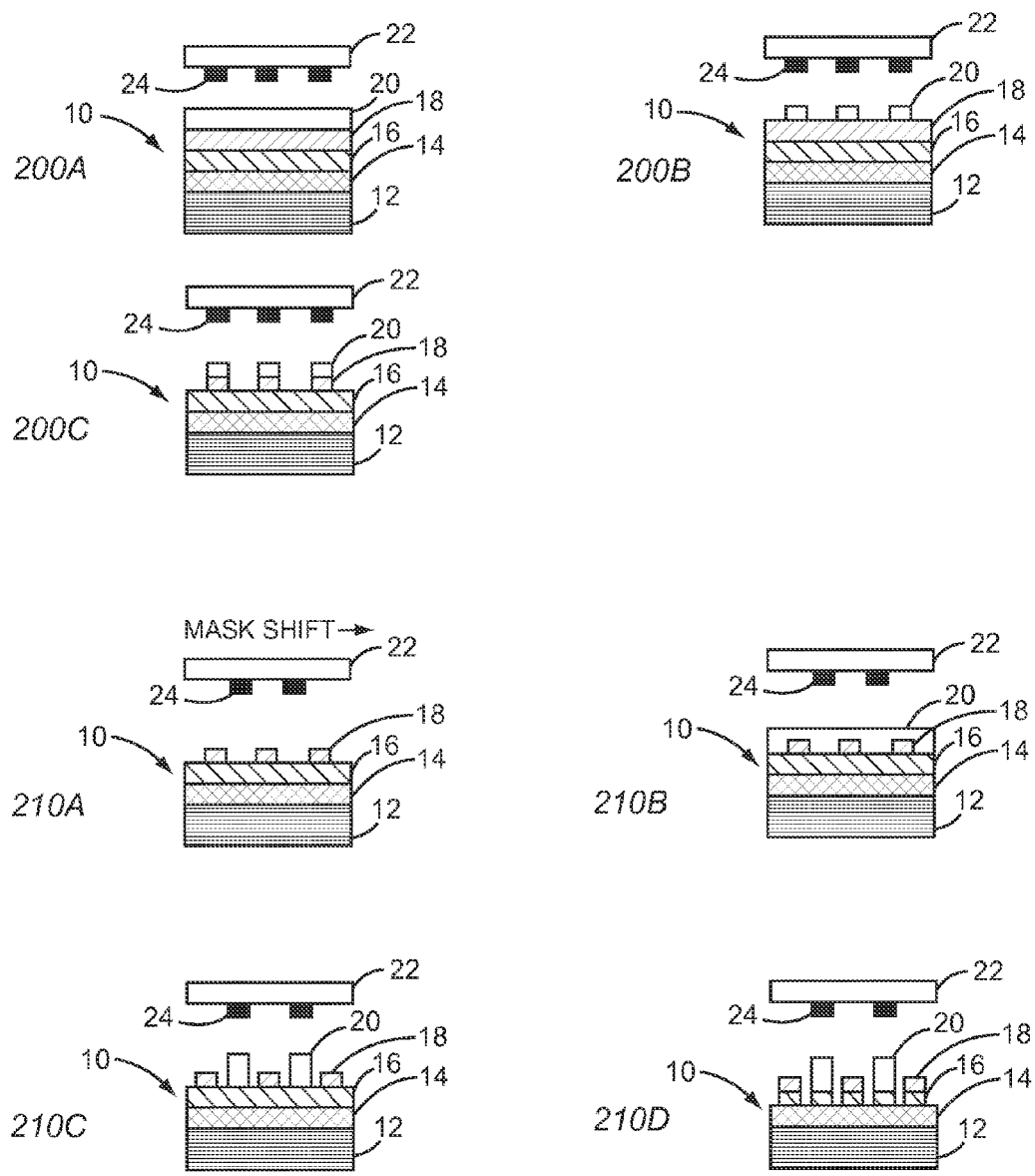
FIG. 3 is an illustration of the process steps of ST-DPL according to an exemplary embodiment disclosed herein.
Figure 3B:
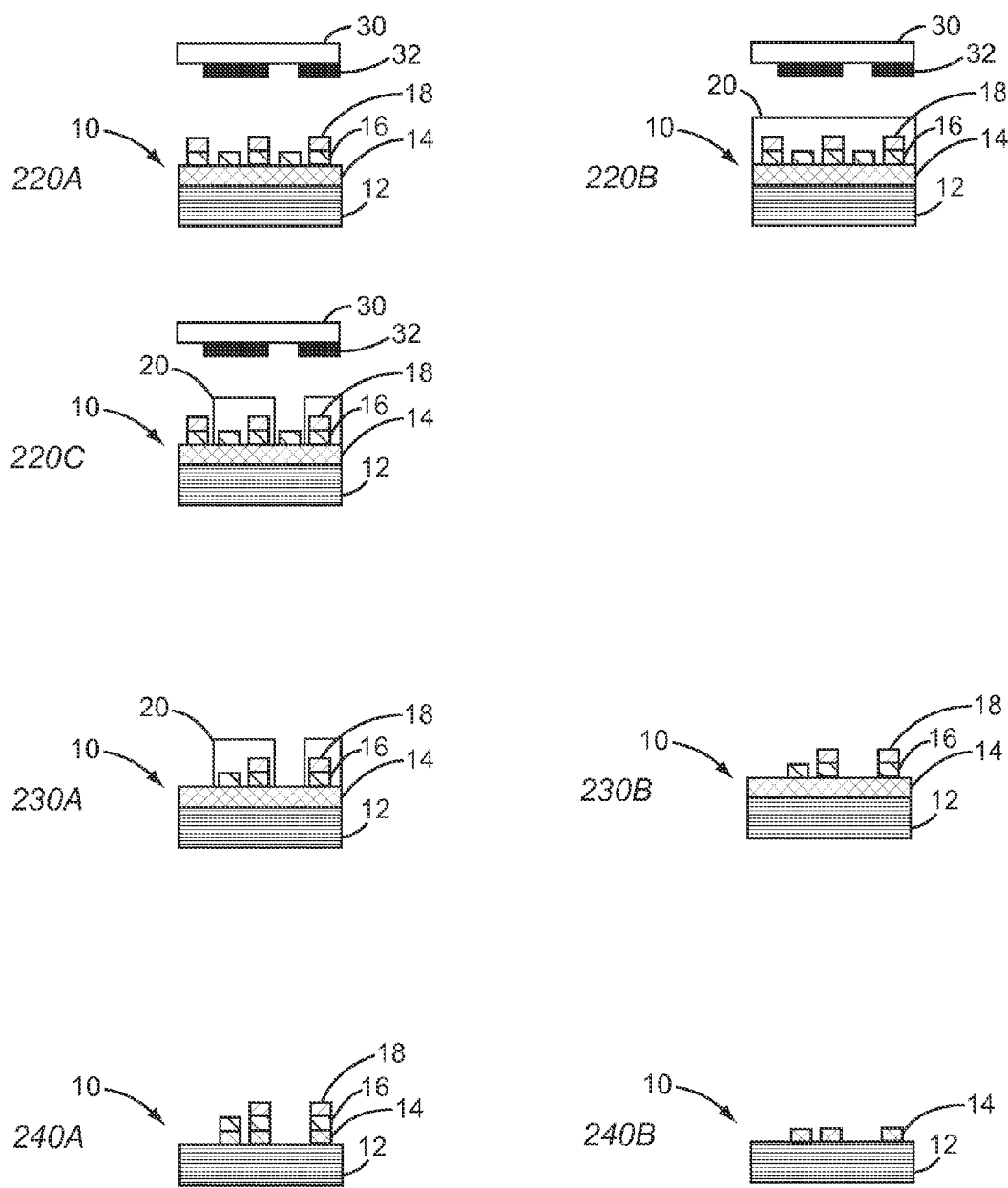

Having described standard DPL, an exemplary embodiment of ST-DPL, with reference to the combination of FIG. 2 and FIG. 3, is now described. FIG. 2 is a flowchart of an exemplary and non-limiting embodiment of ST-DPL while FIG. 3 is a diagram illustrating the individual process steps. As described more fully below with reference to FIG. 4, ST-DPL can be implemented using LELE and LLE positive dual-line and negative dual-trench methodologies with few modifications to the method described in FIG. 2 and FIG. 3. Further, while the exemplary embodiments illustrated herein employ the use of positive resist, it will be obvious to one skilled in the art to employ negative resist requiring few modifications to the manufacturing processes described herein.

With reference to FIG. 2, the process begins when the first pattern 24 on the first mask 24 is printed onto the wafer 10 (step 300). With specific reference to FIG. 3, the first mask 22 is positioned above the wafer 10 formed of the substrate 12 on top of which is deposited the layer to be patterned 14, the second hardmask 16, the first hardmask 18, and the positive photoresist 20. Positioned above the wafer 10 is the first mask 22 (step 200A). The first pattern 24 is printed on the first mask 22 that blocks the transmission of ultraviolet light.

Next, a first lithography is performed whereby the first pattern 24 is transferred to the photoresist 20 via exposure to ultraviolet light with the exposed portions of photoresist 20 being removed, such as by washing away (step 200B).

Next, a first etch is performed to selectively remove the first hardmask 18 (step 200C).

With continuing reference to FIG. 2, the first mask 22 is shifted by a minimum gate pitch X and the first pattern 24 is printed once again (step 302). With specific reference to FIG. 3, the first mask 22 is translated or shifted as indicated, positioned and aligned above the wafer 10 and used once again. It is noted that, in accordance with exemplary embodiments, shifting the first mask 22 does not involve any unloading/reloading of the first mask 22 from the exposure tool. Current exposure tools have the functionality to perform a translational shift automatically with high precision. The remaining photoresist 20 is then removed (step 210A) and a new layer of the photoresist 20 is applied (step 210B). A second lithography is then performed whereby the first pattern 24 is transferred to the photoresist 20 via exposure to ultraviolet light with the exposed portions of the photoresist 20 being removed, such as by washing away (step 210C). A second etch is then performed to selectively remove portions of the second hardmask 16 (step 210D).

With continuing reference to FIG. 2, a non-critical trim mask is then applied to the wafer 10 (step 304). The only extra step that ST-DPL may employ on top of standard DPL is an inexpensive and non-critical trim-exposure cycle (resist coat-expose-develop) and removal of a hardmask corresponding to extra printed features before a final etch. Trim-exposure is a mature and well-known method used in many patterning techniques, such as double-patterning with spacer, alternating phase-shift mask, and subtractive-litho patterning (Intel's 45 nm manufacturing process). Trim-exposure has recently been employed to trim-away printing assist features (PrAF) introduced to enhance the resolution of conventional single-patterning. As illustrated below, the second hardmask layer 16 is necessary in case of positive LELE processes. However, this does not represent an extra requirement since many standard DPL implementations favor the use of the second hardmask 16. As described more fully below, the requirements for trim-exposure are minimal and allow for trim-exposure to be carried out on second-tier scanners with little impact on the overall throughput.

With specific reference to FIG. 3, a trim mask 30 having a trim pattern 32 is positioned and aligned above the wafer 10.

The remaining photoresist 20 is then removed (step 220A) and a new layer of the photoresist 20 is applied (step 220B). Next, a trim lithography is performed whereby the trim pattern 32 is transferred to the photoresist 20 (step 220C).

Next, both the first hardmask 18 and the second hardmask 16 are selectively etched away (step 230A). The remaining photoresist 20 is then removed (step 230B). Then, the layer to be patterned 14 is etched (step 240A) and, finally, the remaining first hardmask 18 and the second hardmask 16 are removed (step 240B).

While described with exemplary reference to positive dual-line LELE ST-DPL, various other processes may be employed including, but not limited to, negative dual-trench LELE ST-DPL, positive dual-line LLE ST-DPL, and negative dual-trench LLE ST-DPL. FIG. 4 is an illustration of positive dual-line LELE ST-DPL, described above, as well as each of these alternative processes in an abbreviated form.

Figure 4A:
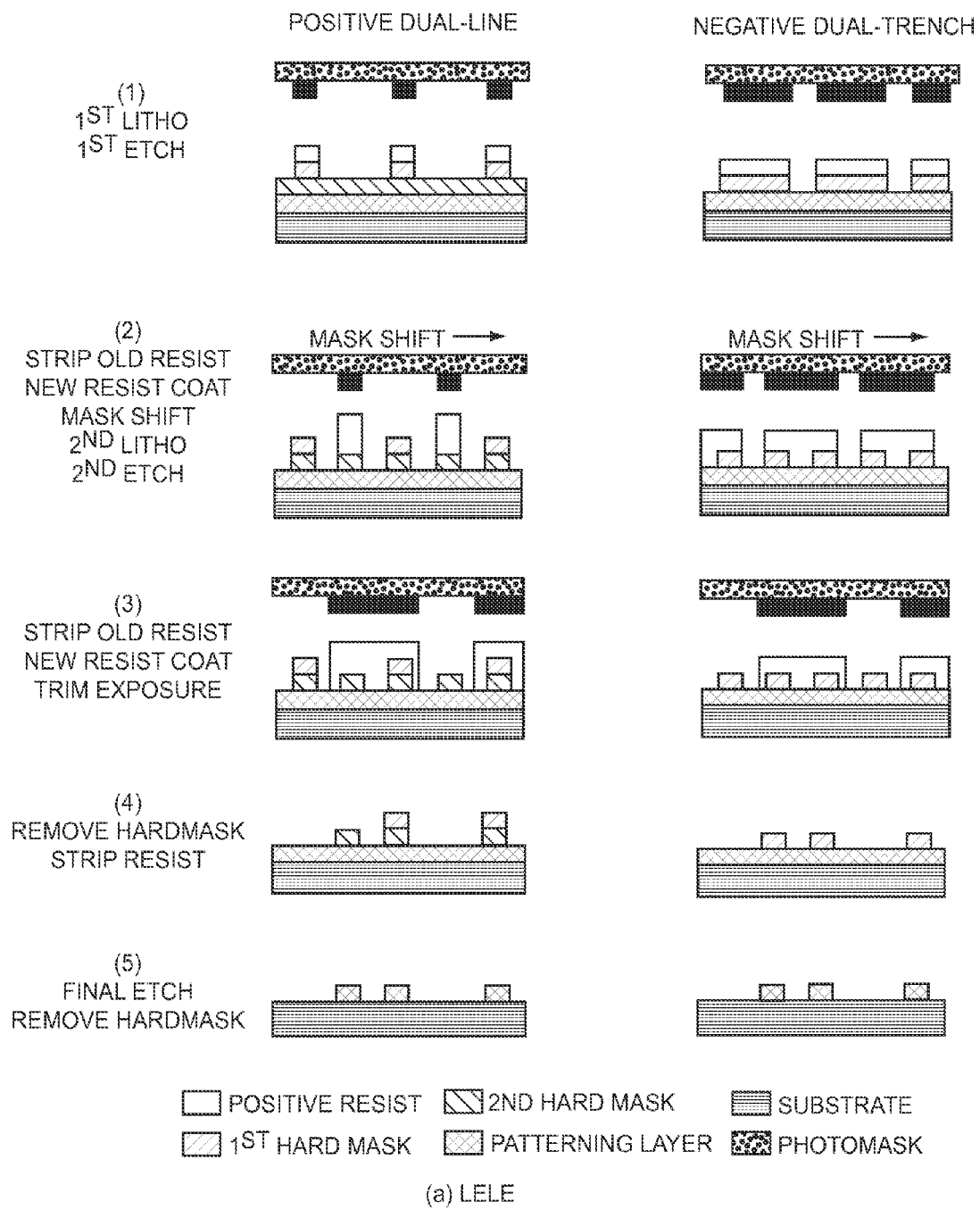
FIG. 4 is an abbreviated illustration of the process steps of ST-DPL as applied to various fabrication techniques.
Figure 4B:
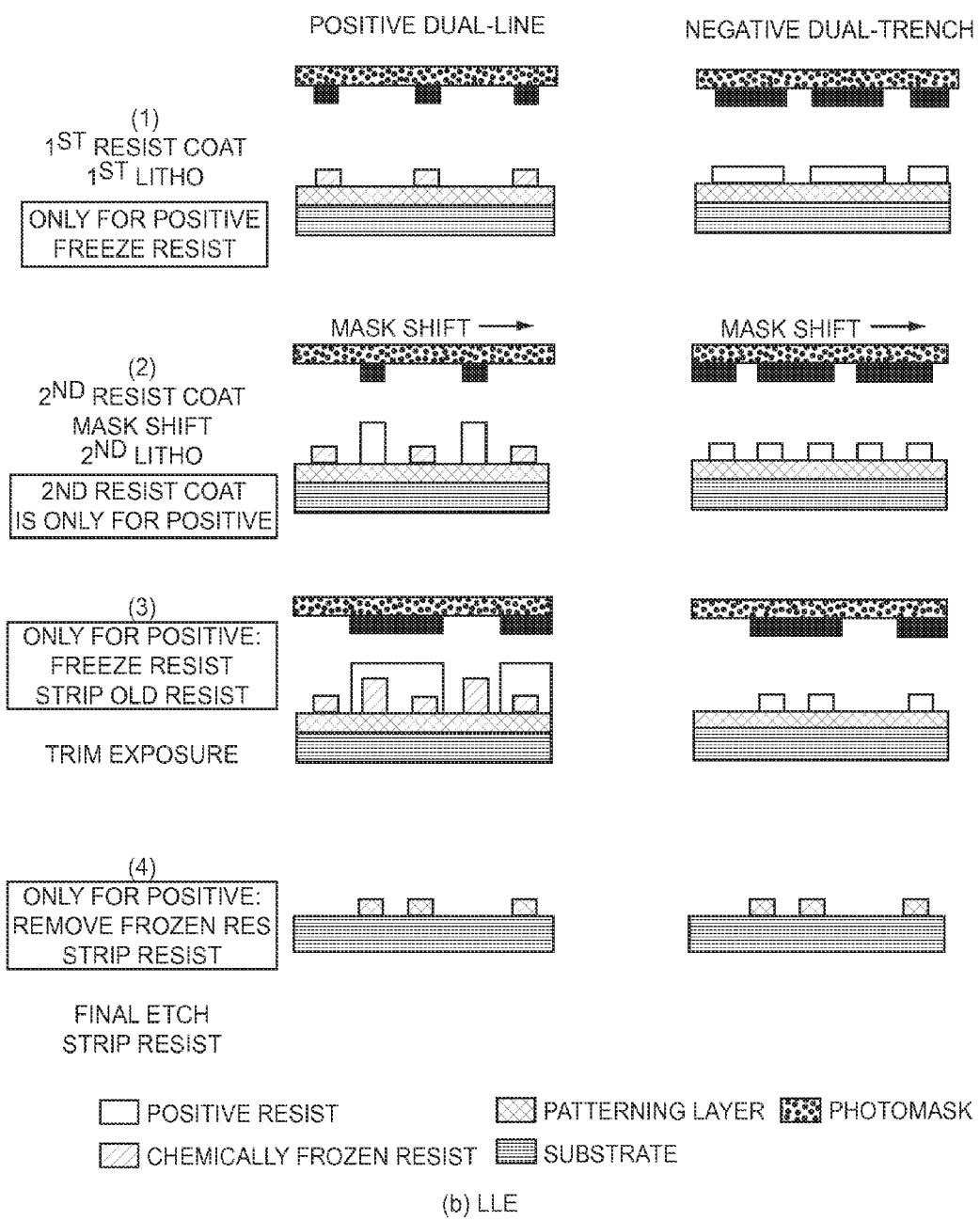

Note that the processes of FIG. 4A are LELE while those of FIG. 4B are LLE processes. Each process is further divided into a positive dual-line example and a negative dual-trench example. Note that in each of the five steps for the LELE examples and the four steps for the LLE examples, numerous substeps are recited with the resultant structure illustrated. For example, steps 200A through 200C of FIG. 3 are illustrated and cited to as:

(1)
first litho
first etch, where the accompanying image displays the result in the positive dual-line column (identical to that of step 200C in FIG. 3). In this manner, various other exemplary processes are illustrated. Note that in all of the illustrated exemplary ST-DPL processes, a single first mask 22 is shifted or otherwise translated and utilized for a second lithography.

It has therefore been shown that a single mask may be translated or shifted and used to perform a second etch in ST-DPL. A method by which a final layout is decomposed into the first pattern 24 that may be superimposed upon itself after a predetermined shift for use in a fabrication process to produce the final layout is now discussed. As used herein, "final layout" refers to a desired final pattern, such as a polysilicon pattern, to be fabricated on a wafer.

Figure 5:
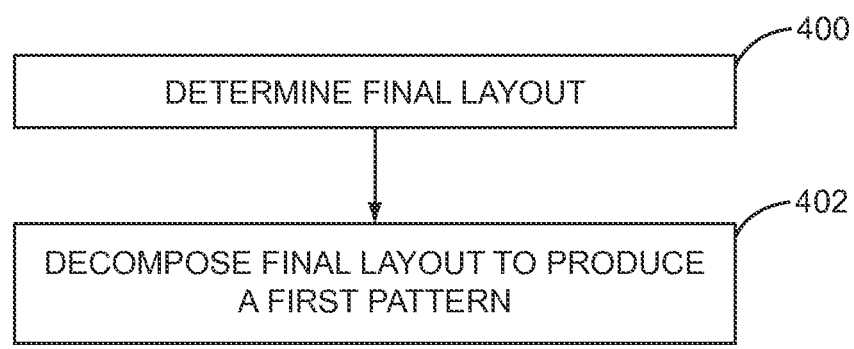
FIG. 5 is a flowchart of producing a first pattern for ST-DPL according to an exemplary embodiment disclosed herein.

FIG. 5 is an illustration of an exemplary embodiment of a method whereby a final layout is decomposed into the first pattern 24. As described more fully above and below, the first pattern 24 forms a part of the first mask 22 to be used, for example, in performing lithography. First, a final layout is determined (step 400). In an exemplary embodiment described more fully below, the final layout may be derived from an existing layout forming, for example, part of a standard cell library (e.g., Nangate 45 nm open cell library). As described below, the requirements of ST-DPL may require modifications to a desired pattern to produce a final pattern.

Next, the final layout is decomposed to produce the first pattern 24 (step 402). Specifically, first pattern 24 is derived such that, when applied, shifted a predetermined amount, and superimposed upon itself, renders a superset of the final layout. Note that the superset so formed may be restricted, via the application of the trim mask 30, to result in the final layout. ST-DPL can be applied to all layers including, but not limited to, active, polysilicon, contacts, metal, and via layers. Hereafter, there is demonstrated the viability of the proposed method by employing it to pattern the polysilicon layer.

For the purposes of describing exemplary methods by which first masks 22 having desired first patterns 24 may be derived, potential final layout types are divided into three general categories, specifically, (1) poly fixed pitch grating, (2) unidirectional poly designs with non-fixed pitch grating, and (3) bidirectional-poly. Examples of each are discussed below.

When describing the exemplary imposition of layout restrictions below, "X" is the amount that the first mask 22 is shifted or otherwise translated and "$X_0$" is the minimum gate pitch of the final layout. As described below, $X_0$ is typically equal to X. The following layout restrictions are purely exemplary and have been found, through experimentation, to aid in the derivation of first patterns 24 that, when utilized in practice, aid in the creation of functioning circuits with a reduced number of fabrication errors. The use of the layout restrictions described herein may be applied to ST-DPL in whole or in part as required based upon, in part, the fabrication process utilized.

The following three exemplary layout restrictions for the first pattern 24 may be used:

1. Gate-pitch is restricted: every other gate, pitch is either X or $<=X_0$.
2. In light of (1), minimum gate spacing is equal to contacted-gate spacing (equal to X minus poly-line width).
3. Poly routing is restricted to top and bottom routing channels of the cell (i.e. poly-routing in the center of the cell is not allowed).

ST-DPL implementation for a final layout comprised of poly fixed pitch grating is straightforward and requires little redesign effort. In such a case, the ST-DPL first pattern 24 consists of a fixed-pitch grating but with a perfect 2X pitch relaxation.

ST-DPL for unidirectional poly designs with non-fixed pitch grating requires a small redesign of the final layout. In particular, adjustment of the pitch between some poly lines in the final layout might be necessary to enforce layout restriction (1). In practice this restriction can often be met in real designs because a majority of the gates in the final layout are at contacted-pitch (equal to X) from at least one of its two neighbors. The derived first pattern 24 for this type of design consists of simple unidirectional lines with twice the minimum pitch of single patterning.

Figure 6:
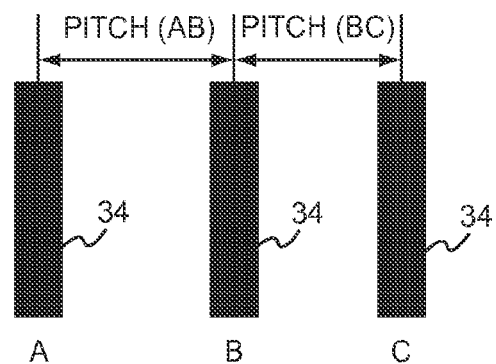
FIG. 6 is an illustration of an exemplary layout restriction for a single mask according to an exemplary embodiment disclosed herein.

An example of layout restriction (1) is provided in FIG. 6. FIG. 6 is an illustration of three unidirectional poly lines 34 with non-fixed pitch as might appear in a final layout. Specifically, the pitch of poly line A and poly line B (Pitch(AB)) is different from the pitch of poly line B and poly line C (Pitch(BC)). In the case that Pitch(AB) is $<X_0$ but different than X, Pitch(BC) is restricted to either X or $>=X_0$. The same restriction applies to Pitch(AB) if Pitch(BC) is unrestricted.

Figure 7A:
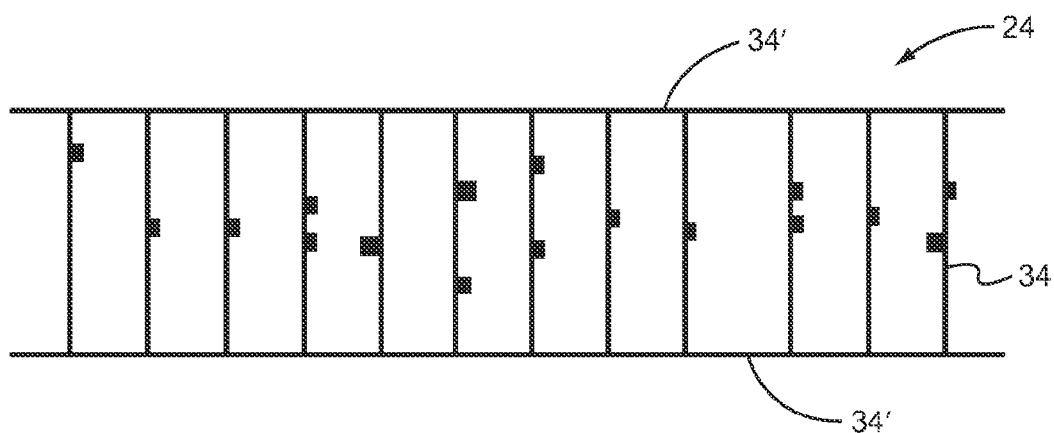
FIGS. 7A and 7B are illustrations of two alternate first masks corresponding to the same final layout according to an exemplary embodiment disclosed herein.
Figure 7B:
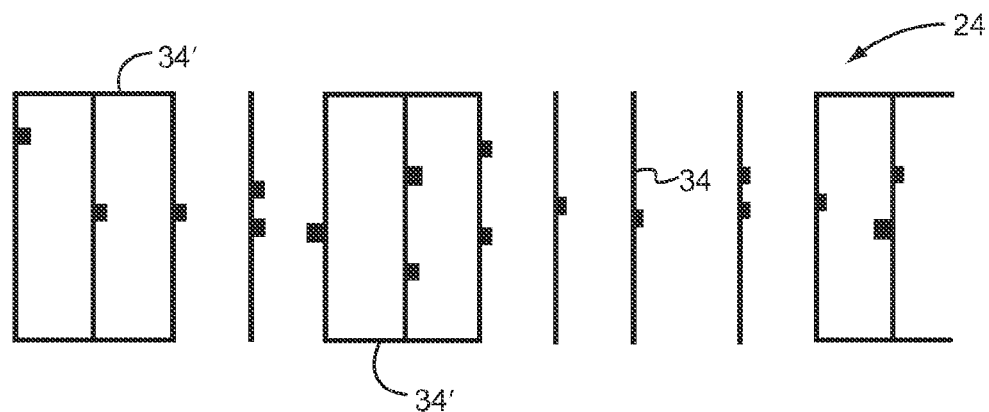

Conventional logic and sequential circuits that involve bidirectional poly lines may be decomposed into different first patterns 24. FIGS. 7A and 7B are illustrations of two different derived first patterns 24 both of which can be used in ST-DPL to create the same final layout. It is therefore the case that the derivation of the first pattern 24 need not represent a unique solution and may be derived in an automated fashion, manually, or using some combination of the two.

Note that each first pattern 24 includes vertical poly lines 34 and horizontal, or "wrong-way," poly lines 34'. To handle such designs, two poly lines in the opposite direction are added at the top and bottom of the first mask of the cell leading to ladder-like first patterns 24. This permits the use of wrong-way poly lines 34' to connect gates internally within the cell in the top and bottom routing channels. Both first pattern 24 options are possible without substantial effects on the complexity of the trim mask 30. The first pattern 24 of FIG. 7A has wrong-way poly lines 34' whether they are needed or not. On the other hand, the first pattern 24 of FIG. 7B has wrong-way poly lines 34' only when needed. As a result, the first pattern 24 of FIG. 7B results in less corner-rounding due to lithographic imperfections than the first pattern 24 of FIG. 7A. In practice, the relatively greater regularity of the first pattern 24 of FIG. 7A has proven, in some instances, to be more favorable for lithography. In such structures, gate-pitch is twice the minimum pitch of single patterning, i.e., ensuring pitch doubling, and small notches that appear on vertical lines correspond to contact-landing pads, which are not necessary in processes permitting trench contacts. Hereafter, there is described the implementation of ST-DPL in 2-dimensional poly style, which is the most complex for patterning.

Figure 8:
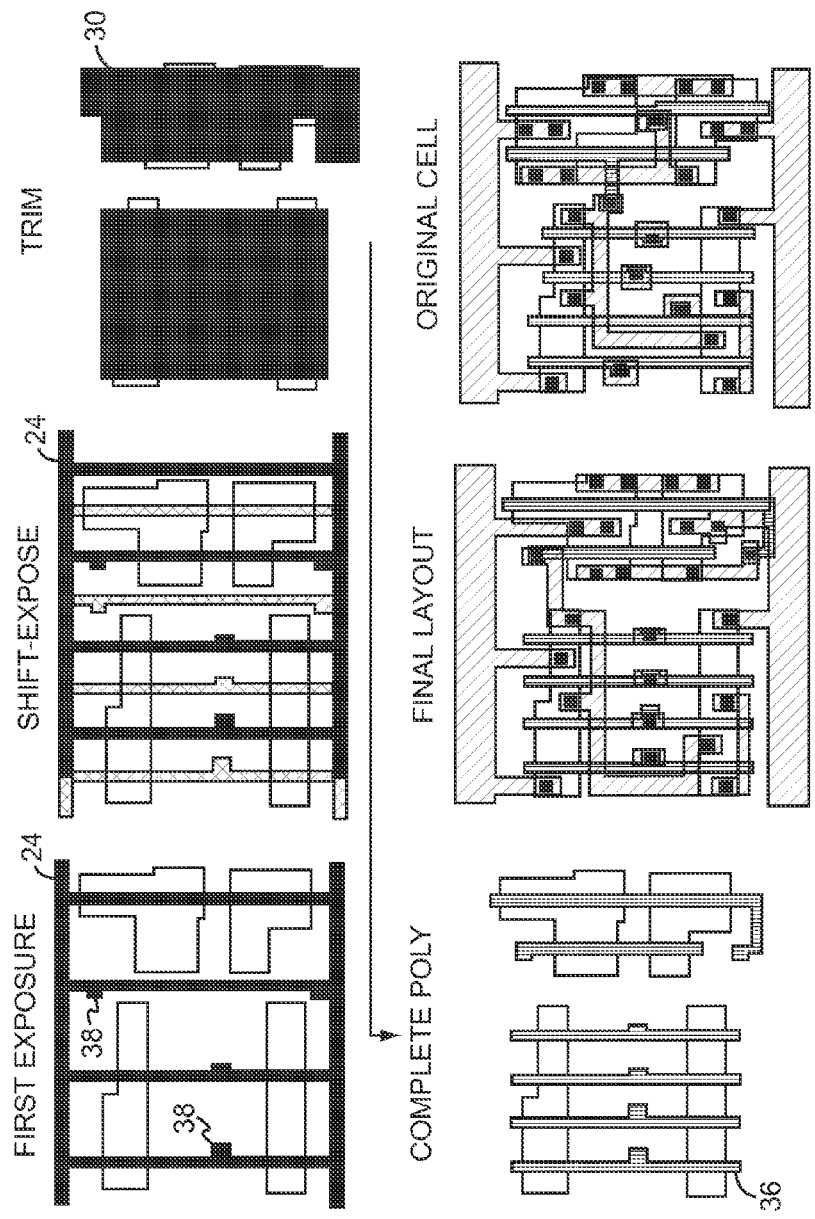
FIG. 8 is an illustration of an exemplary implementation of ST-DPL to create a 4-input OrandInverted (OAI) cell layout.

FIG. 8 is an illustration of an exemplary implementation of ST-DPL to create a 4-input OrandInverted (OAI) cell layout from the Nangate 45 nm open cell library. In the upper-left illustration, the first mask 22 is utilized in a lithographic exposure. Continuing to the right, the next illustration shows a shift-exposure wherein the first mask 24 has been shifted and used once again to perform lithography. Continuing to the right, the next illustration shows the application of the trim mask 30. Continuing to the lower left, a completed poly line final layout 36 is illustrated. Continuing to the right, the final circuit layout is shown including all active, poly, contact, and metal layers. Note that, when compared to the original cell design illustrated at the lower right, minor adjustments to the placement of some of the features were required when establishing the final layout 36. It is further evident that, in this exemplary case, the adjustments required to make the original cell layout compatible with ST-DPL did not impose a requirement of additional area overhead.

In accordance with the exemplary and non-limiting embodiments of ST-DPL described herein, even though the same features are printed with the same surroundings are printed via lithography, albeit in a shifted manner, the printed images of different lithographic steps using the same first pattern will differ as a result of process differences (e.g., resist thickness, hardmask characteristics, etch-interference, etc.). In standard DPL, it is possible to compensate for such differences by using different optical proximity correction (OPC) features for the different patterns. In accordance with exemplary embodiments of ST-DPL, this method may not be possible since the same first mask 22 is used for the first and second exposures. As a result, other means to correct for processing differences between the two patterns may be employed including, but not limited to, dose-mapping.

As evidence of the general applicability of exemplary embodiments of ST-DPL to the fabrication of standard circuit cells, particularly without incurring substantial overhead, ST-DPL was utilized to fabricate a standard-cell library with the results presented in Table 1 below.

TABLE 1

| Cell-type | Original Area [um$_2$] | ST-DPL Area [um$_2$] | Area overhead [um$_2$] |
|---|---|---|---|
| AND2{X2, X4} | 1.064/1.064 | 1.064/1.064 | 0 |
| AND3{X1} | 1.33 | 1.33 | 0 |
| AOI211{X1} | 1.33 | 1.33 | 0 |
| AOI21{X1} | 1.064 | 1.064 | 0 |
| AOI221{X2} | 1.596 | 1.596 | 0 |
| AOI222{X2} | 2.128 | 2.128 | 0 |
| AOI22{X1, X2} | 1.33/1.33 | 1.33/1.33 | 0 |
| BUF{X1, X2} | 0.798/0.798 | 0.798/0.798 | 0 |
| CLKBUF{X1, X2, X3} | 0.798/1.064/1.33 | 0.798/1.064/1.33 | 0 |
| INV{X1, X2} | 0.532/0.532 | 0.532/0.532 | 0 |
| INV{X4} | 0.532 | 0.798 | 0.266 |
| INV{X8} | 0.798 | 1.064 | 0.266 |
| INV{X16} | 1.33 | 1.596 | 0.266 |
| NAND2{X1, X2, X4} | 0.798/0.798/1.33 | 0.798/0.798/1.33 | 0 |
| NAND3{X1} | 1.064 | 1.064 | 0 |
| NAND4{X2} | 1.33 | 1.33 | 0 |
| NOR2{X1, X2} | 0.798/0.798 | 0.798/0.798 | 0 |
| NOR4{X2} | 1.33 | 1.33 | 0 |
| OR2{X1, X2} | 1.064/1.064 | 1.064/1.064 | 0 |
| OR3{X2} | 1.33 | 1.33 | 0 |
| OR4{X2} | 1.596 | 1.596 | 0 |
| OAI21{X1, X2} | 1.064/1.064 | 1.064/1.064 | 0 |
| OAI22{X1} | 1.33 | 1.33 | 0 |
| OAI33{X1} | 1.862 | 1.862 | 0 |
| OAI211{X1, X2, X4} | 1.33/1.33/2.128 | 1.33/1.33/2.128 | 0 |
| XOR2{X1, X2} | 1.596/1.596 | 1.596/1.596 | 0 |
| DFF{X1} | 5.054 | 5.054 | 0 |
| SDFF{X2} | 6.916 | 6.916 | 0 |

Specifically, Table 1 illustrates the area overhead incurred when comparing ST-DPL fabrication of a subset of the Nangate 45 nm open cell library to the same subset fabricated using standard DPL. In the exemplary embodiment illustrated, the first patterns 24 for each cell type were derived using FreePDK 45 nm process design rules.

Experimental results indicate that, for the representative cell-types disclosed above, most standard-cells were made compliant with exemplary embodiments of ST-DPL technology with little redesign effort. However, layout migration of large cells that use poly lines to route gate signals require more redesign time and effort. One reason for this complication arises from contact landing pads 38 being printed in the shifted exposure whether they are needed or not. As a result, unless the part of the poly line 34 containing a landing pad 38 is trimmed away in the printed shifted version of the first pattern 24, enough room must be available on the wafer so that poly-to-active spacing design rules are not violated. In some cases this results in location adjustment of active regions. For a process enabling trench contacts (e.g. Intel's 45 nm process), this complication is eliminated and layout migration can be automated. In an exemplary embodiment, layout decomposition into first and second exposures of the first pattern 24 may be automated such as by, for example, use of a C++ program based on the OpenAccess 2.2 API. Since wrong-way poly lines 34' (horizontal lines of FIG. 7) are printed in both exposures, the decomposition problem is reduced to assigning gate vertical poly lines 34 (vertical lines of FIG. 7) to the two exposures.

The following rules for decomposing the final layout 36 into the first pattern 24 have been shown to be effective in differing applications and are, in all instances, provided as merely exemplary guidelines and are not presented as general requirements for practicing ST-DPL in accordance with any one chosen implementation.

Traversing each poly line 34 of each cell in the library from left to right, the following decomposition rules applies:
  (1) if the pitch with the previous poly line 34 is X, the poly line 34 is assigned to the shifted-exposure (i.e., second exposure of the first pattern 24) and the previous poly line 34 is assigned to the first exposure;
  (2) if the pitch with the previous poly line 34 is $<X_0$ and different than X, the poly line 34 is assigned to the first exposure and the previous line is assigned to the second exposure; and
  (3) if the pitch with the previous line is $>X_0$, the poly line 34 can be assigned to either of the two exposures.

In accordance with some exemplary embodiments of ST-DPL wherein the trim mask 30 covers the entire poly-layer, the poly-layer may be used as a base structure of the trim mask 30 with a series of expansions applied to simplify the trim mask 30. Trim mask structures of two successive gates with pitch $<X_0$ are joined. For gates with larger pitch and gates at the cell-edge, trim-mask structures of each gate are expanded by $S_{min}/2$, where $S_{min}$ is the minimum separation between gates (i.e., X minus gate line-width). This large trim-mask coverage of gates has a large resist thickness at sidewalls after development preventing etch interference with gate features under imperfect overlay and etch control. In an exemplary embodiment, trim mask coverage of field-poly is limited to a predetermined minimum (e.g., 20 nm) on all sides to maximize spacing between the trim mask 30 features. With ST-DPL, the sidewall resist thickness requirement is often less than in the case of gate-poly because critical dimension (CD) control may be less important. Since the vertical poly line 34 ends are formed by printing a long line in one exposure and cutting the ends in another exposure (i.e., trim exposure), line-end tapering and pull-back (a.k.a., shortening) are likewise reduced.

As a result, line-end extension rules, which address trim-to-STI (Shallow Trench Isolation) overlay error and possible damage of line-end by etch in ST-DPL, can be reduced in comparison to standard DPL processes (e.g., from 55 nm with DPL to 35 nm with ST-DPL). In the exemplary illustrated setup, the overall margin of trim-mask overlay error is at least 20 nm in X as well as Y directions.

Based upon experimental results, the following design rule restrictions serve to simplify trim mask 30 fabrication and ensure better quality trimming. As before, these guidelines are exemplary guidelines and are not presented as general requirements for practicing ST-DPL in accordance with any one chosen implementation. The design rule restrictions are as follows:
  (1) Poly line tip-to-side and tip-to-tip within-cell spacing rules are increased (e.g., from 75 nm to 140 nm).
  (2) Top or bottom "wrong-way" poly lines 34' used for routing are pushed toward the center of the cell (e.g., 35 nm).
  (3) Line-ends are extended at most up to the starting location of the "wrong-way" poly lines 34'.

Figure 9:
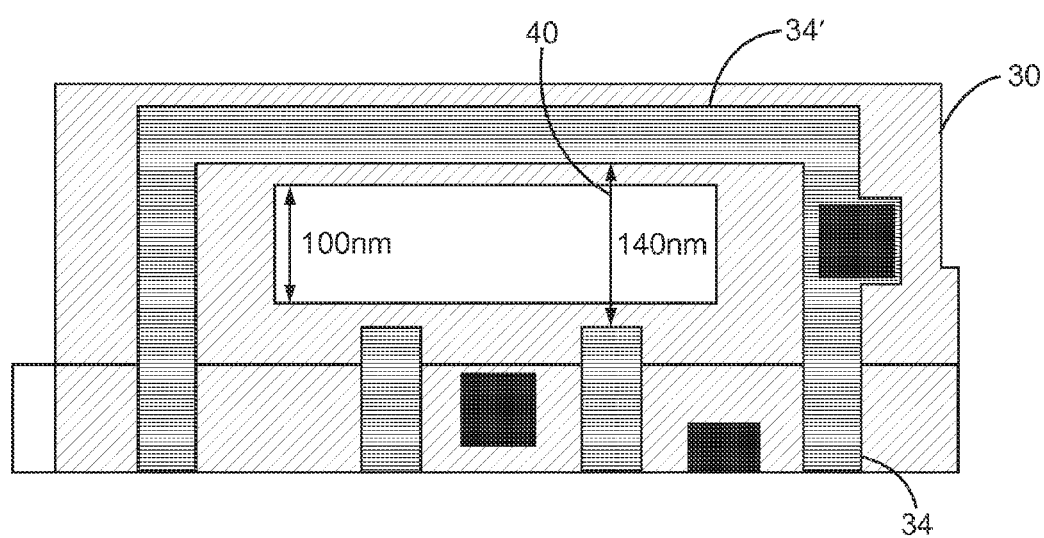
FIG. 9 is an illustration of an exemplary embodiment of a trim mask design consideration.
Figure 10A:
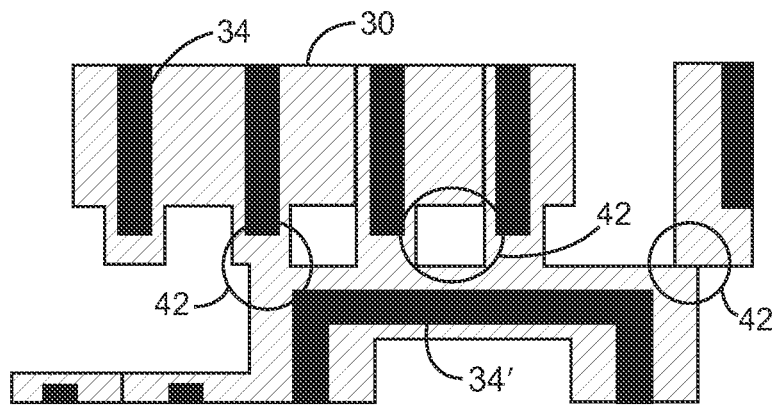
FIGS. 10A and 10B are illustrations of exemplary embodiments of trim mask design considerations.
Figure 10B:
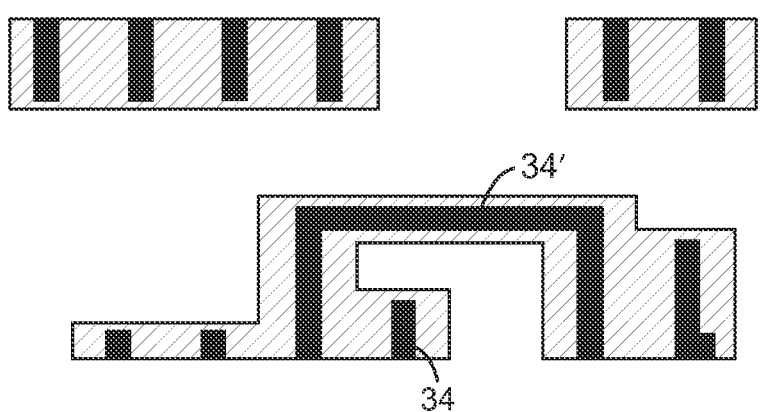

Rule (1) serves to ensure reasonable dimensions of the holes in the trim mask 30 (e.g., at least 100 nm wide) that can occur in such situations within a cell as illustrated in FIG. 9, wherein an example of tip-to-side spacing 40 is illustrated. Rules (2) and (3) are introduced to avoid small holes in the trim mask 30 that might occur at cell boundaries, as illustrated in FIGS. 10A and 10B, resulting in a relaxed separation of at least, for example, 100 nm between trim mask features of different cells. It is again noted that specific measurements (e.g., 75 nm, 140 nm, etc.) are purely exemplary, may be specific only to FreePDK 45 nm processes on which the exemplary cell library is based, and may not be necessary in other exemplary embodiments such as those incorporating other process technologies. For example, rules (2) and (3) may prove unnecessary for commercial processes where line-end gap is considerably larger than the minimum field-poly spacing to meet manufacturability requirements, unlike the requirements of FreePDK where line-end gap rule is equal to the minimum field-poly spacing. In addition, rules (2) and (3) may be not be necessary for a cell library designed for ST-DPL technology rather than migrated from an existing library. In particular, the trim mask 30 simplification at cell-boundaries may be better handled during optimization of cell-height and line-end gap rules.

Figure 11A:
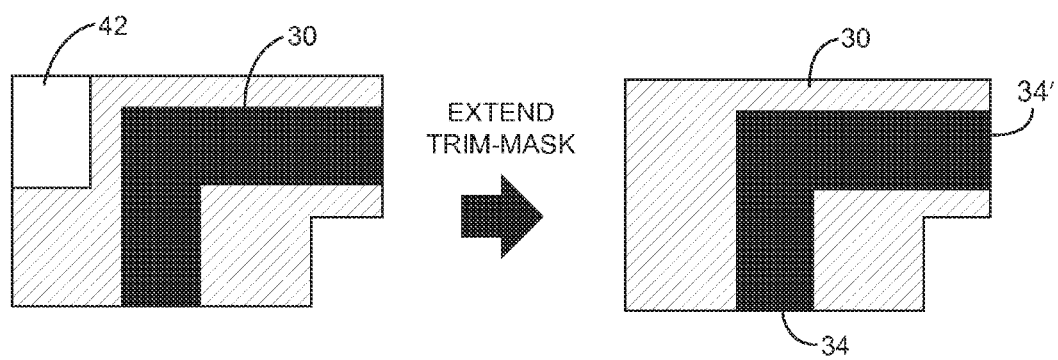
FIGS. 11A and 11B are illustrations of an exemplary embodiment of a trim mask design consideration.
Figure 11B:
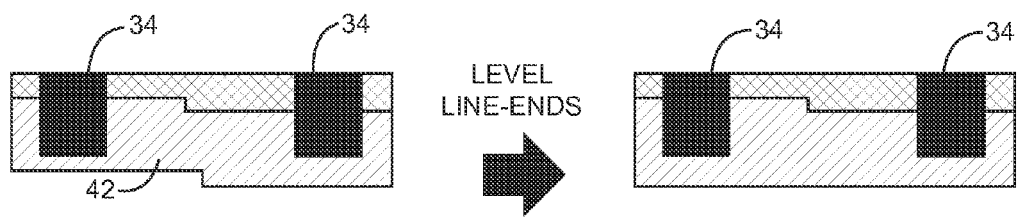

FIG. 11B illustrates notch filling via leveling line-ends of neighboring gates (by extension of the shorter vertical poly line 34 end).

In accordance with an exemplary embodiment, a final step of trim mask 30 simplification is performed to avoid notches wherever possible as illustrated in FIGS. 11A and 11B. In FIG. 11A, a notch-filling notch 42 is performed by extending the trim mask 30 coverage of field-poly. This is not possible if the neighboring gate in the direction of the extension and within close proximity uses the same "wrong-way" poly line 34' to connect to another signal. In such a case, the trim mask extension violates the minimum separation of trim mask features and might create a bridge-defect.

After generating the different masks for all cells in a library and all possible cell orientations, generation of the ST-DPL first mask 22 compatible designs is straightforward. In an exemplary embodiment, for each cell instance, cell-type and orientation are determined and mask features are copied from the corresponding cell in the library to the instance location in the final layout 36. The derived first pattern 24 layout is free of errors at cell boundaries because critical mask features outside the cell (or close to the cell edge) are trimmed away and enough spacing between trim mask features of different cells is guaranteed by construction.

An ST-DPL standard cell library was implemented without additional area overhead compared to the original Nangate 45 nm open library layouts with the exception of three cells as shown in Table 1 above. This overhead is caused by layout restrictions imposed to simplify the trim mask 30 as described above. In case these restrictions are avoided for the reasons discussed earlier, ST-DPL does not have any area overhead in all cells. Moreover, if, for example, the first pattern 24 of FIG. 7B is used instead of the first pattern 24 of FIG. 7A, i.e., having "wrong-way" poly lines 34' only when needed, ST-DPL implementation of these three inverter-cells results in no area overhead because rule (2) can be avoided.

Three designs were synthesized in Cadence RTL Compiler™ 6.2 using a developed ST-DPL standard cell library. Designs were placed and routed using Cadence SOC Encounter TMv6.2. Details on the designs and associated cell area overhead are presented in Table 2 below.

TABLE 2

|  | Description | Cell instances | Cell-types | Flip-flops | INV/BUF | Cell-area [um2] | Area overhead |
|---|---|---|---|---|---|---|---|
| mips789 | processor core | 10529 | 35 | 2011 | 1465 | 22867.5 | 0.02% |
| orl200 | combinational logic | 3070 | 35 | 0 | 890 | 3014.8 | 0.34% |
| usb | com. controller | 478 | 31 | 93 | 52 | 880.2 | 0% |

Figure 12:
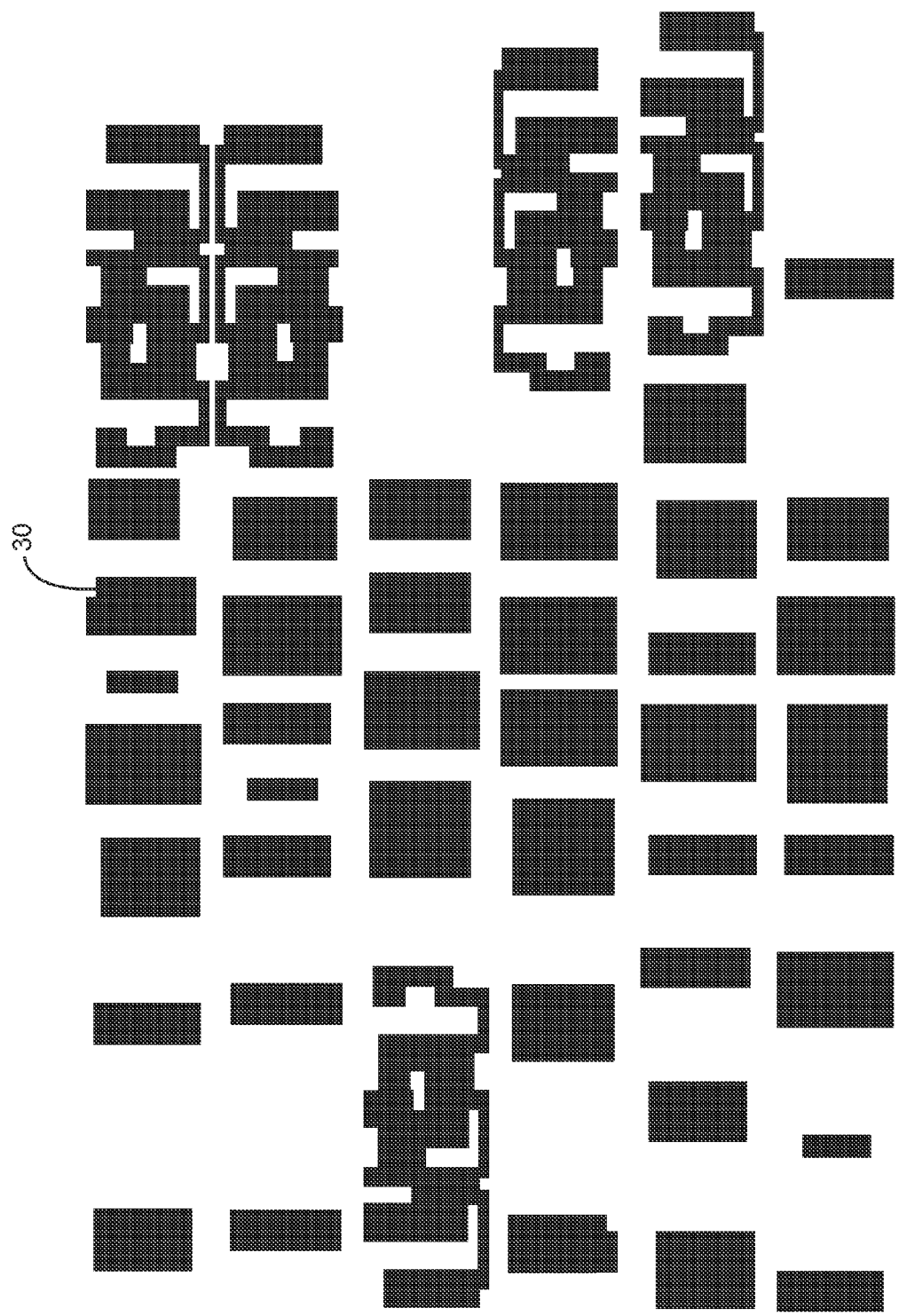
FIG. 12 is an illustration of a trim mask according to an exemplary embodiment disclosed herein.

Cell area overhead for all three designs was low (at most 0.34%). The reason is attributed to low utilization of the cells where area overhead occurs (low utilization of large-size inverters is typical). Trim mask layouts were automatically generated for all three designs. A snippet of a trim mask layout for the "usb" design is illustrated in FIG. 12. As illustrated, simple blocks with few vertices correspond to cells with unidirectional poly and more complex shapes correspond to flip-flops involving bidirectional poly-routing. Hence, the trim for purely unidirectional poly designs consists of simple features (mostly large rectangles).

Trim mask 30 complexity is further analyzed as follows. In Table 3 below, minimum line-width, notch size, hole dimensions, and number of fractures of the exemplary trim mask 30 of FIG. 12 are shown.

TABLE 3

|  | Line-width [nm] | Notch Size [nm] | Hole dimensions [nm] | Overlay margin [nm] | Trim-mask poly fractures | Post-OPC mask fractures |
|---|---|---|---|---|---|---|
| mips789 | .90 | .70 | .190 × 145 | 20 | 78597 | 367633 |
| orl200 | .90 | .70 | .380 × 100 | 20 | 5189 | 43150 |
| usb | .90 | .70 | .190 × 145 | 20 | 2770 | 14404 |

These minimum dimensions are fairly large compared to the minimum feature size of the process (i.e., 50 nm) resulting in a simple trim mask 30 for all designs. The dimensions listed in Table 3 are not to be compared directly to dimensions of the critical mask because trim mask 30 features do not define patterns but rather protect existing patterns by larger coverage. The number of fractures of the trim mask 30 (determined using Calibre MDP™ 2008), which affects mask cost, is 5 to 8 times smaller than the number of features for post-OPC poly-layer (OPC generated using Calibre OPCTMv2008). In addition, the trim mask 30 does not require expensive Resolution Enhancement Techniques (RET) features such as OPC and Subresolution Assist Feature (SRAF) which substantially increase mask complexity and cost.

In addition to cutting mask cost to nearly half that of standard DPL because of first mask 22 reuse for both exposures and a relatively cheap trim mask 30, exemplary embodiments of ST-DPL exhibit benefits in terms of overlay, critical dimension (CD) control, and throughput. For example, a negative LLE process which does not require wafer removal from the exposure tool chuck between the two exposures (as illustrated in FIG. 4) was found to exhibit advantageous throughput benefits. When such a negative LLE process is used in combination with ST-DPL, the second exposure of the shifted first mask 22 can be performed after a blind translational shift without any alignment of the second exposure. This reduces overlay error between the two first pattern 24 exposures and also saves alignment time.

One source of overlay is reticle metrology errors caused by reticle mounting and heating as well as particle contamination of the reticle alignment marks. Since mask loading and unloading between both exposures is not necessary in ST-DPL, this source of overlay error is substantially reduced in ST-DPL process implementations. Moreover, reticle alignment, which is another source of overlay, is again substantially eliminated in ST-DPL processes for the same reason. The time spent on mask loading and unloading as well as reticle alignment is saved.

Another source of overlay is registration error (approximately 25%). In DPL, registration error of the two exposures is observed to be correlated, which greatly reduces its impact on overlay. This correlation is mainly attributed to mask layout similarity. In ST-DPL, registration error is expected to have a higher correlation factor than in the case of standard DPL since mask layout is the same for both exposures.

A summary of ST-DPL benefits is provided in Table 4 below.

TABLE 4

| Source | Overlay contribution | Benefit |
|---|---|---|
| All sources | 100% | almost eliminated in case of negative dual-trench LLE process |
| Reticle metrology | n/a | eliminated for all ST-DPL processes |
| Reticle alignment | n/a | eliminated for all ST-DPL processes |
| Registration | 25% | reduced for all ST-DPL processes |

Whenever two patterns are formed in different exposure and etch steps, lines and spaces have bimodal CD distributions that can have implications for the digital design flow. Since the same first mask 22 is used for both exposures in ST-DPL, mask Critical Dimension Uniformity (CDU), which is a significant contributor to the overall CD variation, no longer affects the difference between the two distributions and the bimodal problem is alleviated.

Considering CD of the first ($CD_a$) and second ($CD_b$) patterns as random variables, then:

$$CD_a = \mu_a + m_a + nm_a,$$

$$CD_b = \mu_b + m_b + nm_b,$$

where $\mu_{a-}$ and $\mu_b$ are the mean of $CD_a$ and $CD_b$ CD respectively, mm is mask CDU random variable and nm (short for nonmask) is a random variable corresponding to all other contributors to line CDU. Assuming $CD_a a$, $CD_b b$, and all other random variables of Equation 2 have independent normal distributions in standard-DPL, the covariance of the two CD distributions is zero and CD difference has a normal distribution with μdiff=μa−μb and $$\sigma \text{diff} = \sqrt{\sigma_a^2 + \sigma_b^2}, d$$

where $\sigma_a$ and $\sigma_b$ are the standard deviations of $CD_a$ and $CD_b$ distributions respectively. In case of ST-DPL, $m_a=m_b=m$ and, consequently, the covariance is $$\begin{aligned}\text{Cov}(a,b) &= E(a,b) - \mu_a \times \mu_b \\ &= \mu_a \times \mu_b + \mu_a(m+nm_b) + \mu_b(m+nm_a) + \\ &\quad m(nm_a + nm_b) + nm_a \times nm_b + m^2 - \mu_a \times \mu_b \\ &= \mu_a(m+nm_b) + \mu_b(m+nm_a) + m(nm_a+nm_b) + nm_a \times \\ &\quad nm_b + m^2.\end{aligned}$$

Since m, $nm_a$nma, and $nm_b$nmb have zero mean, Equation 3 simplifies to $$\text{Cov}(a,b) = \sigma_m^2,$$

where $\sigma_m$_m is the standard deviation of mask CDU normal distribution. The distribution of CD difference has $\mu\text{diff}=\mu_a-\mu_b$ and $$\sigma\text{diff} = \sqrt{\sigma_a^2 + \sigma_b^2 - 2\text{Cov}(a,b)} = \sqrt{\sigma_a^2 + \sigma_b^2 - 2\sigma_m^2} \_a$$

(from Equation 3). Using line-CDU breakdown values for LELE positive dual-line 32 nm process (i.e. 2.7 nm 3σ from etch, 1.4 nm 3σ_ from mask-CDU, 0.7 nm 3σ_ from dose, and 0.5 nm 3σ_ from focus), σdiff is 1.49 nm in the case of standard-DPL and 1.34 nm in the case of ST-DPL which corresponds to a 10.3% reduction in standard deviation.

In conclusion, ST-DPL technology described with reference to exemplary embodiments herein is compared to other popular patterning techniques including standard DPL and subtractive-litho. Essentially, subtractive-litho consists of printing a grating and removing dummy-poly with a trim-exposure. A summary of attributes is presented in Table 5 below.

Table 5

|  | Subtractive-litho | Standard-DPL | ST-DPL |
| --- | --- | --- | --- |
| Mask-cost | best | worst | intermediate |
| Trim | yes | no | yes |
| Pitch doubling | no | yes | yes |
| Area overhead | worst | best | best |
| Designing effort | worst | none | intermediate |
| Layout decomposition | none | tough | trivial |
| Variability | best | worst | intermediate |
| CD bimodality | no | yes | reduced |
| Same-layer Overlay | no | yes | reduced |
| Throughput | best | worst | intermediate |

Subtractive-litho can suffer from a large area overhead when fixed-gate pitch is imposed. Even though this technique has good printability due to its imposed regular layout, it does not achieve pitch-doubling which might be necessary to enable scaling to future technology nodes. As is evident, ST-DPL has many advantages over standard DPL as discussed above. ST-DPL designs are compatible with spacer double patterning (SDP) technology enabling poly-routing with almost no mask-assignment effort. Hence, cell or block reuse from one technology to the other is possible. Trim-exposure non-criticality allows ST-DPL processing on second-rate fabrication lines and its use permits the reduction of line-end extension rules as discussed above.

It is therefore evident that ST-DPL as described with reference to exemplary embodiments herein is a viable and promising technique to achieve 2X pitch relaxation. ST-DPL allays numerous DPL impediments including, but not limited to, cost, overlay control, CD performance, and throughput. In the case of LLE negative dual-trench process, ST-DPL reduces overlay error between the two patterns of the same layer extending the lifetime of scanners to future nodes.

Those skilled in the art will recognize improvements and modifications to the preferred embodiments of the present invention. All such improvements and modifications are considered within the scope of the concepts disclosed herein and the claims that follow.

What is claimed is:

1. A method of printing a layout on a wafer comprising:
    printing a first pattern from a first mask located at a first position onto the wafer;
    shifting the first mask by a predetermined distance to a second position; and
    printing the first pattern from the first mask located at the second position onto the wafer such that the first pattern is superimposed upon itself after shifting the first mask by the predetermined distance to thereby provide a superset of a desired final layout.

2. The method of claim 1 wherein printing the first pattern located at the first position and printing the first pattern located at the second position comprises a lithographic process.

3. The method of claim 2 wherein the lithographic process is selected from a group consisting of a positive dual-line litho-etch-litho-etch (LELE) process, a negative dual-trench LELE process, a positive dual-line litho-litho-etch (LLE) process, and a negative dual-trench LLE process.

4. The method of claim 1 wherein the first mask is a photomask.

5. The method of claim 1 wherein the predetermined distance is equal to a minimum features pitch of the desired final layout.

6. The method of claim 5 wherein the minimum features pitch is a minimum gate pitch.

7. The method of claim 1 wherein the first pattern is comprised of one or more vertical lines and no more than two horizontal lines per standard-cell layout.

8. The method of claim 7 wherein each of the no more than two horizontal lines is restricted to a position selected from a group consisting of a top of the first pattern and a bottom of the first pattern.

9. The method of claim 7 further comprising decomposing the desired final layout into the first pattern.

10. The method of claim 1 further comprising applying a trim mask to the wafer to provide the desired final layout.

* * * * *